United States Patent
Wallace et al.

(10) Patent No.: US 10,297,467 B2
(45) Date of Patent: *May 21, 2019

(54) SELF-ALIGNED VIA AND PLUG PATTERNING FOR BACK END OF LINE (BEOL) INTERCONNECTS

(71) Applicant: Intel Corporation, Santa Clara, CA (US)

(72) Inventors: Charles H. Wallace, Portland, OR (US); Paul A. Nyhus, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/490,804

(22) Filed: Apr. 18, 2017

(65) Prior Publication Data

US 2017/0221810 A1 Aug. 3, 2017

Related U.S. Application Data

(63) Continuation of application No. 14/914,095, filed as application No. PCT/US2013/062323 on Sep. 27, 2013, now Pat. No. 9,666,451.

(51) Int. Cl.
*H01L 23/48* (2006.01)
*H01L 23/52* (2006.01)
(Continued)

(52) U.S. Cl.
CPC ........ *H01L 21/486* (2013.01); *H01L 21/4846* (2013.01); *H01L 21/764* (2013.01);
(Continued)

(58) Field of Classification Search
CPC . H01L 2924/15174; H01L 2924/15184; H01L 23/522; H01L 23/5226; H01L 23/53295
(Continued)

(56) References Cited

U.S. PATENT DOCUMENTS

| 5,888,897 A | 3/1999 | Liang |
| 9,041,217 B1 | 5/2015 | Bristol et al. |

(Continued)

FOREIGN PATENT DOCUMENTS

| CN | 102709180 | 10/2012 |
| TW | 424302 | 3/2001 |
| TW | 200841417 | 10/2008 |

OTHER PUBLICATIONS

International Search Report and Written Opinion from PCT/US2013/062323 dated Jun. 27, 2014, 15 pgs.
(Continued)

*Primary Examiner* — Sheila V. Clark
(74) *Attorney, Agent, or Firm* — Schwabe, Williamson & Wyatt P.C.

(57) ABSTRACT

Self-aligned via and plug patterning for back end of line (BEOL) interconnects is described. In an example, an interconnect structure for an integrated circuit includes a first layer of the interconnect structure disposed above a substrate. The first layer includes a grating of alternating metal lines and dielectric lines in a first direction. A second layer of the interconnect structure is disposed above the first layer. The second layer includes a grating of alternating metal lines and dielectric lines in a second direction, perpendicular to the first direction. Each metal line of the grating of the second layer is disposed on a recessed dielectric line having alternating distinct regions of a first dielectric material and a second dielectric material corresponding to the alternating metal lines and dielectric lines of the first layer of the interconnect structure. Each dielectric line of the grating of the second structure has a continuous region of a third dielectric material distinct from the alternating distinct regions of the first dielectric material and the second dielectric material.

19 Claims, 14 Drawing Sheets

(51) Int. Cl.
*H01L 29/40* (2006.01)
*H01L 21/48* (2006.01)
*H01L 21/764* (2006.01)
*H01L 23/498* (2006.01)
*H01L 21/768* (2006.01)
*H01L 23/528* (2006.01)
*H01L 23/522* (2006.01)
*H01L 23/532* (2006.01)

(52) U.S. Cl.
CPC .. *H01L 21/76801* (2013.01); *H01L 21/76816* (2013.01); *H01L 21/76897* (2013.01); *H01L 23/498* (2013.01); *H01L 23/49827* (2013.01); *H01L 23/49838* (2013.01); *H01L 23/49894* (2013.01); *H01L 23/528* (2013.01); *H01L 23/5226* (2013.01); *H01L 23/53295* (2013.01); *H01L 2924/0002* (2013.01)

(58) Field of Classification Search
USPC .................................................. 257/758, 759
See application file for complete search history.

(56) References Cited

U.S. PATENT DOCUMENTS

| | | | | |
|---|---|---|---|---|
| 9,666,451 | B2 * | 5/2017 | Wallace | ............... H01L 21/486 |
| 2003/0193286 | A1 | 10/2003 | Otterman et al. | |
| 2005/0233503 | A1 | 10/2005 | Leib et al. | |
| 2009/0032967 | A1 | 2/2009 | Becker et al. | |
| 2010/0032846 | A1 | 2/2010 | Chidambarrao et al. | |
| 2012/0091560 | A1 * | 4/2012 | Riess | ................. H01L 23/5223 257/532 |
| 2012/0168849 | A1 * | 7/2012 | Choi | ................. H01L 27/11582 257/324 |
| 2012/0313251 | A1 | 12/2012 | Kato | |
| 2013/0072017 | A1 | 3/2013 | Belledent et al. | |
| 2013/0230981 | A1 | 9/2013 | Kawamura | |
| 2013/0252420 | A1 | 9/2013 | Sandhu | |
| 2015/0093702 | A1 | 4/2015 | Nyhus et al. | |
| 2015/0170961 | A1 | 6/2015 | Romero et al. | |
| 2016/0086850 | A1 | 3/2016 | Romero et al. | |
| 2016/0170961 | A1 | 6/2016 | Seow et al. | |
| 2017/0005260 | A1 * | 1/2017 | Annunziata | ............. H01L 43/02 |
| 2017/0269481 | A1 * | 9/2017 | Borodovsky | ......... G03F 7/2037 |

OTHER PUBLICATIONS

Non-Final Office Action for Taiwan Patent Application No. 103130257 dated Oct. 26, 2015, 4 pages.
International Preliminary Report on Patentability from PCT/US2013/062323 dated Apr. 7, 2016, 7 pgs.
Extended European Search Report for European Patent Application No. 13894130.7, dated Apr. 26, 2017, 7 pgs.,.
Office Action from Chinese Patent Application No. 201380079116.2, dated Jan. 2, 2018, 5 pages.
Notice of Allowance for Taiwan Patent Application No. 103130257, dated Mar. 17, 2016, 2 pages.
Second Office Action from Chinese Patent Application No. 201380079116.2, dated Sep. 7, 2018, 3 pages, no translation.

* cited by examiner

SELF-ALIGNED VIA AND PLUG PATTERNING FOR BACK END OF LINE (BEOL) INTERCONNECTS

CLAIM OF PRIORITY

This application is a continuation of U.S. patent application Ser. No. 14/914,095, filed on Feb. 24, 2016, which is a U.S. National Phase application under 35 U.S.C. § 371 of International Application No. PCT/US2013/062323, filed Sep. 27, 2013, entitled "SELF-ALIGNED VIA AND PLUG PATTERNING FOR BACK END OF LINE (BEOL) INTERCONNECTS" the entire contents of which are incorporated herein by reference.

TECHNICAL FIELD

Embodiments of the invention are in the field of semiconductor structures and processing and, in particular, self-aligned via and plug patterning for back end of line (BEOL) interconnects.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

Integrated circuits commonly include electrically conductive microelectronic structures, which are known in the arts as vias, to electrically connect metal lines or other interconnects above the vias to metal lines or other interconnects below the vias. Vias are typically formed by a lithographic process. Representatively, a photoresist layer may be spin coated over a dielectric layer, the photoresist layer may be exposed to patterned actinic radiation through a patterned mask, and then the exposed layer may be developed in order to form an opening in the photoresist layer. Next, an opening for the via may be etched in the dielectric layer by using the opening in the photoresist layer as an etch mask. This opening is referred to as a via opening. Finally, the via opening may be filled with one or more metals or other conductive materials to form the via.

In the past, the sizes and the spacing of vias has progressively decreased, and it is expected that in the future the sizes and the spacing of the vias will continue to progressively decrease, for at least some types of integrated circuits (e.g., advanced microprocessors, chipset components, graphics chips, etc.). One measure of the size of the vias is the critical dimension of the via opening. One measure of the spacing of the vias is the via pitch. Via pitch represents the center-to-center distance between the closest adjacent vias.

When patterning extremely small vias with extremely small pitches by such lithographic processes, several challenges present themselves, especially when the pitches are around 70 nanometers (nm) or less and/or when the critical dimensions of the via openings are around 35 nm or less. One such challenge is that the overlay between the vias and the overlying interconnects, and the overlay between the vias and the underlying landing interconnects, generally need to be controlled to high tolerances on the order of a quarter of the via pitch. As via pitches scale ever smaller over time, the overlay tolerances tend to scale with them at an even greater rate than lithographic equipment is able to keep up.

Another such challenge is that the critical dimensions of the via openings generally tend to scale faster than the resolution capabilities of the lithographic scanners. Shrink technologies exist to shrink the critical dimensions of the via openings. However, the shrink amount tends to be limited by the minimum via pitch, as well as by the ability of the shrink process to be sufficiently optical proximity correction (OPC) neutral, and to not significantly compromise line width roughness (LWR) and/or critical dimension uniformity (CDU).

Yet another such challenge is that the LWR and/or CDU characteristics of photoresists generally need to improve as the critical dimensions of the via openings decrease in order to maintain the same overall fraction of the critical dimension budget. However, currently the LWR and/or CDU characteristics of most photoresists are not improving as rapidly as the critical dimensions of the via openings are decreasing.

A further such challenge is that the extremely small via pitches generally tend to be below the resolution capabilities of even extreme ultraviolet (EUV) lithographic scanners. As a result, commonly two, three, or more different lithographic masks may be used, which tend to increase the costs. At some point, if pitches continue to decrease, it may not be possible, even with multiple masks, to print via openings for these extremely small pitches using EUV scanners.

Thus, improvements are needed in the area of via manufacturing technologies.

BRIEF DESCRIPTION OF THE DRAWINGS

FIGS. 1-12 illustrate portions of integrated circuit layers representing various operations in a method of self-aligned via and metal patterning, in accordance with an embodiment of the present invention, where:

FIG. 1 illustrates a plan view and corresponding cross-sectional views of options for a previous layer metallization structure;

FIG. 2 illustrates a plan view and corresponding cross-sectional views of the structure of FIG. 1 following formation of interlayer dielectric (ILD) lines above the structure of FIG. 1;

FIG. 3 illustrates a plan view and corresponding cross-sectional views of the structure of FIG. 2 following selective differentiation all of the potential via locations from all of the plug locations;

FIG. 5 illustrates a plan view and corresponding cross-sectional views of the structure of FIG. 4A following removal of one species of polymer;

FIG. 6 illustrates a plan view and corresponding cross-sectional views of the structure of FIG. 5 following formation of an ILD material in the locations opened upon removal of the one species of polymer;

FIG. 7 illustrates a plan view and corresponding cross-sectional views of the structure of FIG. 6 following via patterning;

FIG. 8 illustrates a plan view and corresponding cross-sectional views of the structure of FIG. 7 following via formation;

FIG. 9 illustrates a plan view and corresponding cross-sectional views of the structure of FIG. 8 following removal of the second species of polymer and replacement with an ILD material;

FIG. 10 illustrates a plan view and corresponding cross-sectional views of the structure of FIG. 9 following patterning of a resist or mask in selected plug locations;

FIG. 11 illustrates a plan view and corresponding cross-sectional views of the structure of FIG. 10 following hardmask removal and ILD layer recessing;

FIG. 12 illustrates a plan view and corresponding cross-sectional views of the structure of FIG. 11 following metal line formation.

DESCRIPTION OF THE EMBODIMENTS

Figure 1:
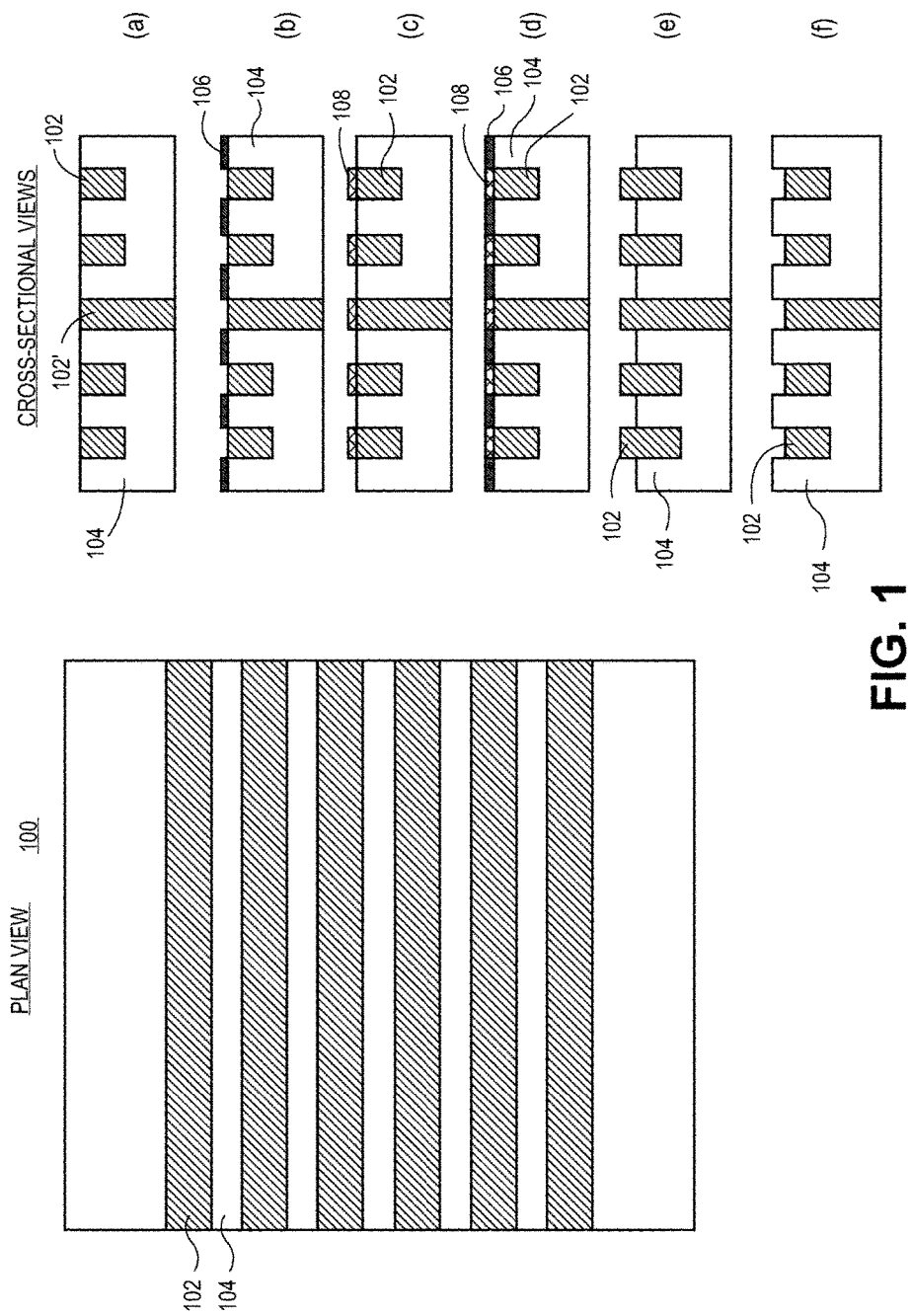

Self-aligned via and plug patterning for back end of line (BEOL) interconnects is described. In the following description, numerous specific details are set forth, such as specific integration and material regimes, in order to provide a thorough understanding of embodiments of the present invention. It will be apparent to one skilled in the art that embodiments of the present invention may be practiced without these specific details. In other instances, well-known features, such as integrated circuit design layouts, are not described in detail in order to not unnecessarily obscure embodiments of the present invention. Furthermore, it is to be understood that the various embodiments shown in the Figures are illustrative representations and are not necessarily drawn to scale.

One or more embodiments described herein are directed to self-aligned via and plug patterning. The self-aligned aspect of the processes described herein may be based on a directed self-assembly (DSA) mechanism, as described in greater detail below. However, it is to be understood that selective growth mechanisms may be employed in place of, or in combination with, DSA-based approaches. In an embodiment, processes described herein enable realization of self-aligned metallization for back-end of line feature fabrication.

To provide context, patterning and aligning of features at less than approximately 50 nanometer pitch requires many reticles and critical alignment strategies that are extremely expensive for a semiconductor manufacturing process. Generally, embodiments described herein involve the fabrication of metal and via patterns based on the positions of an underlying layer. That is, in contrast to conventional top-down patterning approaches, a metal interconnect process is effectively reversed and built from the previous layer up. This is in contrast to a conventional approach where an interlayer dielectric (ILD) is first deposited, with a pattern for metal and via layers subsequently patterned therein. In the conventional approach, alignment to a previous layer is performed using a lithography scanner alignment system. The ILD is then etched.

More specifically, one or more embodiments are directed to an approach that employs an underlying metal as a template to build the conductive vias and non-conductive spaces or interruptions between metals (referred to as "plugs"). Vias, by definition, are used to land on a previous layer metal pattern. In this vein, embodiments described herein enable amore robust interconnect fabrication scheme since alignment by lithography equipment is no longer relied on. Such an interconnect fabrication scheme can be used to save numerous alignment/exposures, can be used to improve electrical contact (e.g., by reducing via resistance), and can be used to reduce total process operations and processing time otherwise required for patterning such features using conventional approaches.

As illustrated below, self-aligned via and metal patterning approaches described herein may include one or more of the following aspects or attributes: (a) a bottom up super-self-aligned via/metal patterning process is enabled; (b) a previous layer metal is used to direct positions of vias on the layer formed above; (c) a process that generates every possible via and metal line end position but maintains only required or desired via and metal line end positions; (d) the position and shape of vias and metal line ends are pre-formed from a previous layer pattern; (e) an intersection of metal below and above naturally forms the fully self-aligned via positions; (f) via and plugs position, size and shape are defined by a pre-existing grating lithography from underlying metal layers; (g) via and plug lithography is required only for selecting one or another and does not affect the position, shape or size of the features (e.g., LWR is irrelevant); (h) processes described herein may be characterized as an upside down dual-damascene or via/plug first approach; (i) corresponding lithography photoresist design can be simplified since greater tolerance is achieved in the selection of via and plug locations within a layer (this may be referred to as a "bucket" approach, where a photoresist is merely used fill a plurality of generated holes, where only certain holes are subsequently selected to be maintained or deleted); (j) LWR is not critical and faster resists can be used; (k) the size of the features can be fabricated as a single shape and size, and may be applicable for electron beam direct write (EBDW) processes; and (k) via design rules are simplified and all possible vias are allowed in any geometric configuration, where the size of the vias is completely defined by the intersection of the metal above and below.

FIGS. 1-12 illustrate portions of integrated circuit layers representing various operations in a method of self-aligned via and metal patterning, in accordance with an embodiment of the present invention. In each illustration at each described operation, plan views are shown on the left-hand side, and corresponding cross-sectional views are shown on the right-hand side. These views will be referred to herein as corresponding cross-sectional views and plan views.

FIG. 1 illustrates a plan view and corresponding cross-sectional views of options for a previous layer metallization structure, in accordance with an embodiment of the present invention. Referring to the plan view and corresponding cross-section view option (a), a starting structure 100 includes a pattern of metal lines 102 and interlayer dielectric (ILD) lines 104. The starting structure 100 may be patterned in a grating-like pattern with metal lines spaced at a constant pitch and having a constant width (e.g., for a DSA embodiment, but not necessarily needed for a directed selective growth embodiment), as is depicted in FIG. 1. The pattern, for example, may be fabricated by a pitch halving or pitch quartering approach. Some of the lines may be associated with underlying vias, such as line 102' shown as an example in the cross-sectional views.

Referring again to FIG. 1, alternative options (b)-(f) address situations where an additional film is formed (e.g., deposited, grown, or left as an artifact remaining from a previous patterning process) on a surface of one of, or both of, the metal lines 102 and interlayer dielectric lines 104. In example (b), an additional film 106 is disposed on the interlayer dielectric lines 104. In example, (c), an additional film 108 is disposed on the metal lines 102. In example, (d) an additional film 106 is disposed on the interlayer dielectric lines 104, and an additional film 108 is disposed on the metal lines 102. Furthermore, although the metal lines 102 and the interlayer dielectric lines 104 are depicted as co-planar in (a), in other embodiments, they are not co-planar. For example, in (e), the metal lines 102 protrude above the interlayer dielectric lines 104. In example, (f), the metal lines 102 are recessed below the interlayer dielectric lines 104.

Referring again to examples (b)-(d), an additional layer (e.g., layer 106 or 108) can be used as a hardmask (HM) or protection layer or be used to enable a selective growth and/or self-assembly described below in association with subsequent processing operations. Such additional layers may also be used to protect the ILD lines from further processing. In addition, selectively depositing another material over the metal lines may be beneficial for similar reasons. Referring again to examples (e) and (f), it may also be possible to recess either the ILD lines or the metal lines with any combination of protective/HM materials on either or both surfaces. Overall, there exist numerous options at this stage for preparing ultimately underlying surfaces for a selective or directed self-assembly process.

In an embodiment, as used throughout the present description, interlayer dielectric (ILD) material, such as the material of the interlayer dielectric lines 104, is composed of or includes a layer of a dielectric or insulating material. Examples of suitable dielectric materials include, but are not limited to, oxides of silicon (e.g., silicon dioxide ($SiO_2$)), doped oxides of silicon, fluorinated oxides of silicon, carbon doped oxides of silicon, various low-k dielectric materials known in the arts, and combinations thereof. The interlayer dielectric material may be formed by conventional techniques, such as, for example, chemical vapor deposition (CVD), physical vapor deposition (PVD), or by other deposition methods.

In an embodiment, as is also used throughout the present description, interconnect material, such as the material of metal lines 102, is composed of one or more metal or other conductive structures. A common example is the use of copper lines and structures that may or may not include barrier layers between the copper and surrounding ILD material. As used herein, the term metal includes alloys, stacks, and other combinations of multiple metals. For example, the metal interconnect lines may include barrier layers, stacks of different metals or alloys, etc. The interconnect lines are also sometimes referred to in the arts as traces, wires, lines, metal, or simply interconnect. As will be described further below, top surfaces of the lower interconnect lines may be used for self-aligned via and plug formation.

In an embodiment, as is also used throughout the present description, hardmask materials, such, as layers 106 or 108 if included as a hardmask, are composed of dielectric materials different from the interlayer dielectric material. In one embodiment, different hardmask materials may be used in different regions so as to provide different growth or etch selectivity to each other and to the underlying dielectric and metal layers. In some embodiments, a hardmask layer includes a layer of a nitride of silicon (e.g., silicon nitride) or a layer of an oxide of silicon, or both, or a combination thereof. Other suitable materials may include carbon-based materials. In another embodiment, a hardmask material includes a metal species. For example, a hardmask or other overlying material may include a layer of a nitride of titanium or another metal (e.g., titanium nitride). Potentially lesser amounts of other materials, such as oxygen, may be included in one or more of these layers. Alternatively, other hardmask layers known in the arts may be used depending upon the particular implementation. The hardmask layers maybe formed by CVD, PVD, or by other deposition methods.

It is to be understood that the layers and materials described in association with FIG. 1 are typically formed on or above an underlying semiconductor substrate or structure, such as underlying device layer(s) of an integrated circuit. In an embodiment, an underlying semiconductor substrate represents a general workpiece object used to manufacture integrated circuits. The semiconductor substrate often includes a wafer or other piece of silicon or another semiconductor material. Suitable semiconductor substrates include, but are not limited to, single crystal silicon, polycrystalline silicon and silicon on insulator (SOI), as well as similar substrates formed of other semiconductor materials. The semiconductor substrate, depending on the stage of manufacture, often includes transistors, integrated circuitry, and the like. The substrate may also include semiconductor materials, metals, dielectrics, dopants, and other materials commonly found in semiconductor substrates. Furthermore, the structure depicted in FIG. 1 may be fabricated on underlying lower level interconnect layers.

Figure 2:
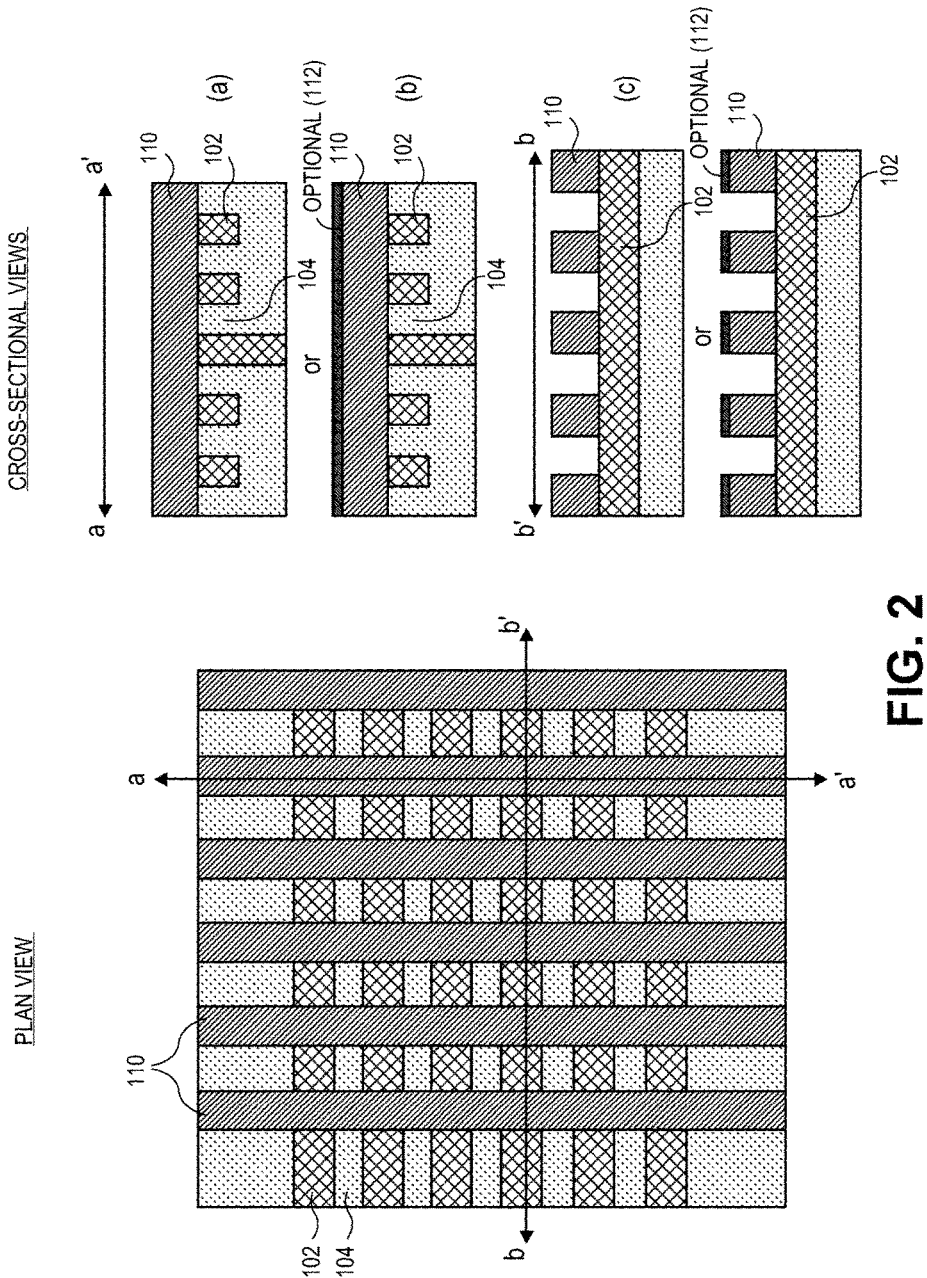

FIG. 2 illustrates a plan view and corresponding cross-sectional views of the structure of FIG. 1 following formation of interlayer dielectric (ILD) lines 110 above the structure of FIG. 1, in accordance with an embodiment of the present invention. Referring to the plan view and corresponding cross-sectional views (a) and (c) taken along axes a-a' and c-c', respectively, the ILD lines 110 are formed in a grating structure perpendicular to the direction of underlying lines 104. In an embodiment, a blanket film of the material of lines 110 is deposited by chemical vapor deposition or like techniques. In an embodiment, the blanket film is then patterned using lithography and etch processing which may involve, e.g., spacer-based-quadruple-patterning (SBQP) or pitch quartering. It is to be understood that the grating pattern of lines 110 can be fabricated by numerous methods, including EUV and/or EBDW lithography, directed self-assembly, etc. As will be described in greater detail below, subsequent metal layer will thus be patterned in the orthogonal direction relative to the previous metal layer since the grating of lines 110 is orthogonal to the direction of the underlying structure. In one embodiment, a single 193 nm lithography mask is used with alignment/registration to the previous metal layer 102 (e.g., grating of lines 110 aligns to the previous layer 'plug' pattern in X and to the previous metal grating in Y). Referring to cross-sectional structures (b) and (d), a hardmask 112 may be formed on, or retained following pattering of, dielectric lines 110. The hardmask 112 can be used to protect lines 110 during subsequent patterning steps. As described in greater detail below, the formation of lines 110 in a grating pattern exposes regions of the previous metal lines 102 and previous ILD lines 104 (or corresponding hardmask layers on 102/104). The exposed regions correspond to all possible future via locations where metal is exposed. In one embodiment, the previous layer metal layer (e.g., lines 102) is protected, labeled, brushed, etc. at this point in the process flow.

Figure 3:
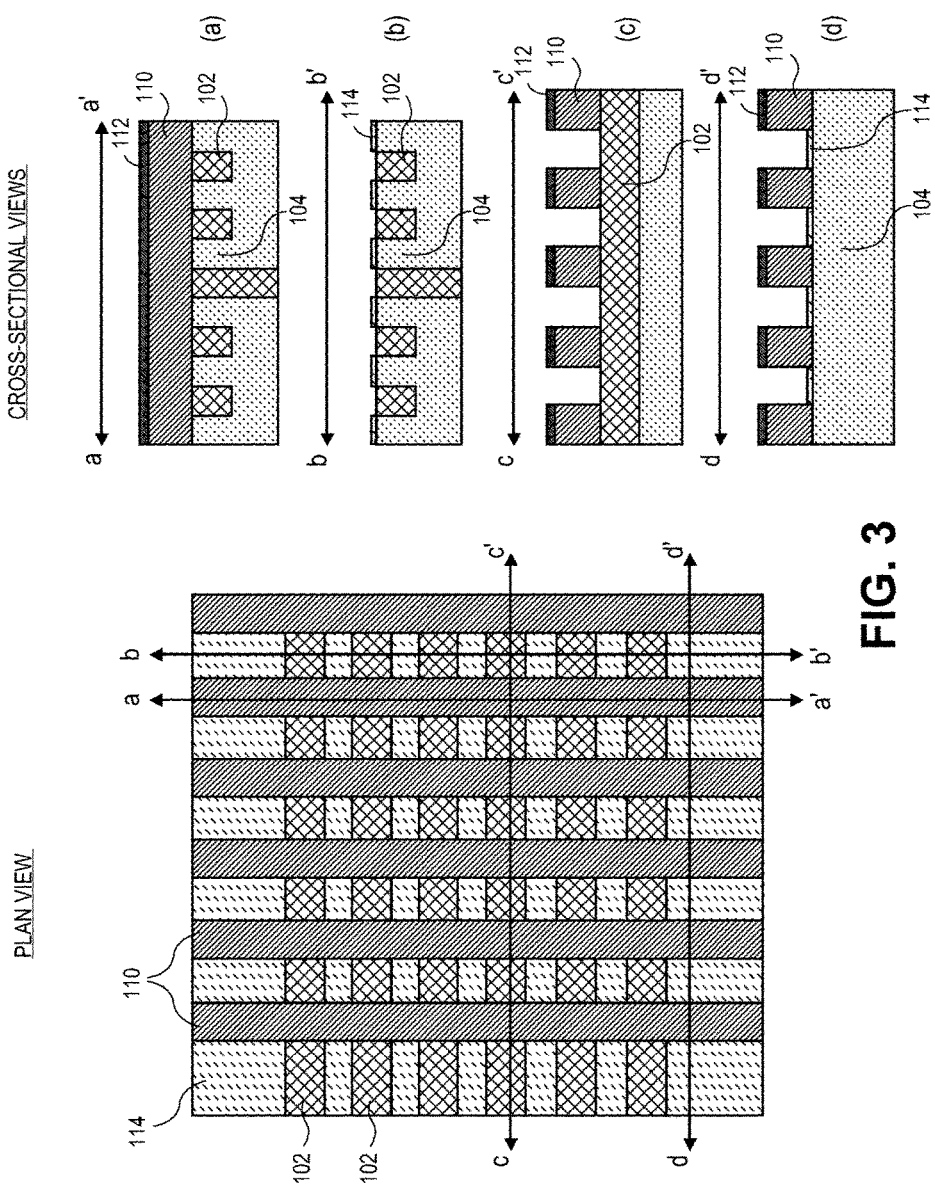

FIG. 3 illustrates a plan view and corresponding cross-sectional views of the structure of FIG. 2 following selective differentiation all of the potential via locations from all of the plug locations, in accordance with an embodiment of the present invention. Referring to the plan view and corresponding cross-sectional views (a)-(d) taken along axes, a-a', b-b', c-c' and d-d', respectively, following formation of ILD lines 110, a surface modification layer 114 is formed on exposed regions of the underlying ILD lines 104. In an embodiment, surface modification layer 114 is a dielectric layer. In an embodiment, surface modification layer 114 is formed by a selective bottom-up growth approach. In one such embodiment, the bottom-up growth approach involves a directed self-assembly (DSA) brush coat that has one polymer component which assembles preferentially on the underlying ILD lines 104 or, alternatively, on the metal lines 102 (or on a sacrificial layer deposited or grown on the underlying metal or ILD material).

Figure 4A:
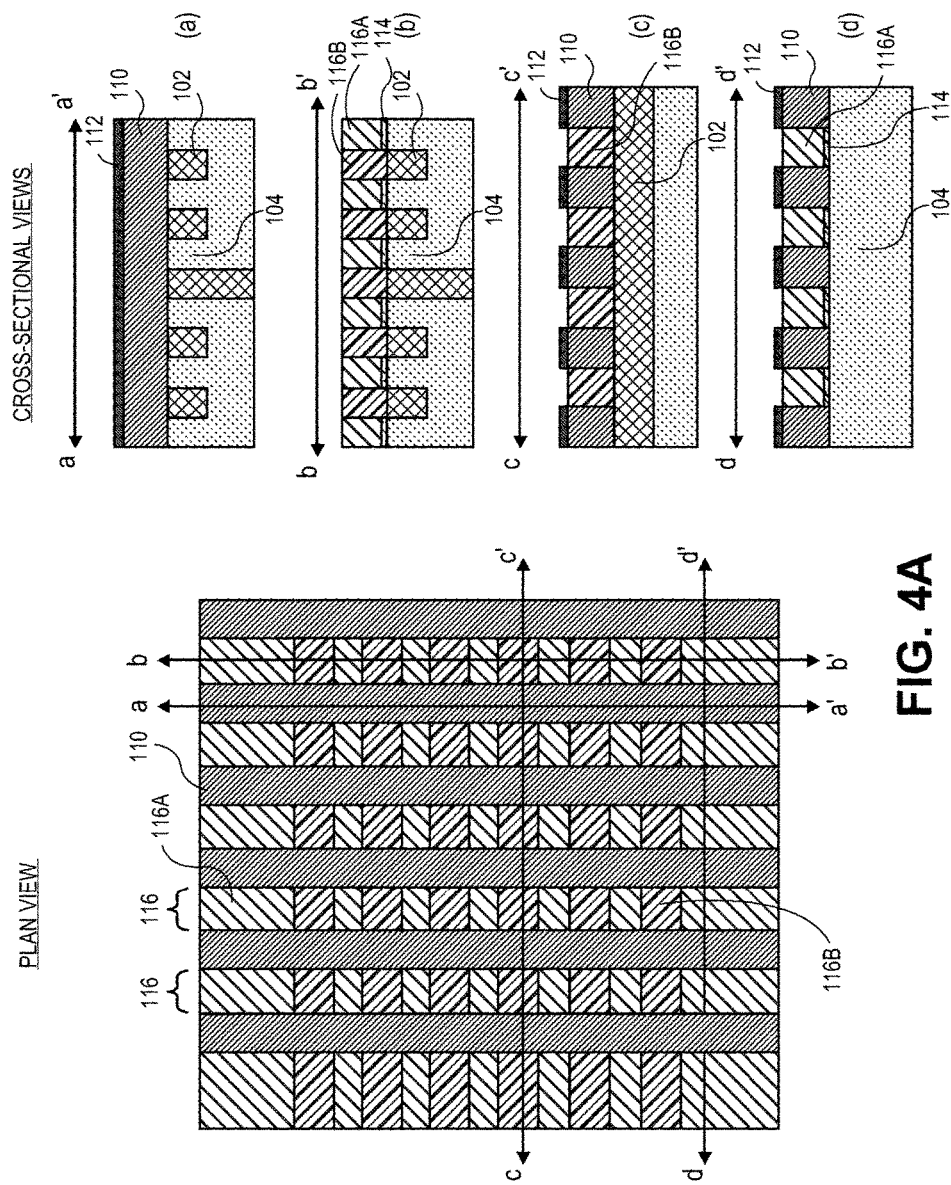
FIG. 4A illustrates a plan view and corresponding cross-sectional views of the structure of FIG. 3 following differential polymer addition to the exposed portions of underlying metal and ILD lines of FIG. 3.

FIG. 4A illustrates a plan view and corresponding cross-sectional views of the structure of FIG. 3 following differential polymer addition to the exposed portions of underlying metal and ILD lines of FIG. 3, in accordance with an embodiment of the present invention. Referring to the plan view and corresponding cross-sectional views (a)-(d) taken along axes, a-a', b-b', c-c' and d-d', respectively, directed self-assembly (DSA) or selective growth on exposed portions of the underlying metal/ILD 102/104 grating is used to form intervening lines 116 with alternating polymers or alternating polymer components in between the ILD lines 110. For example, as shown, polymer 116A (or polymer component 116A) is formed on or above the exposed portions of interlayer dielectric (ILD) lines 104 of FIG. 3, while polymer 116B (or polymer component 116B) is formed on or above the exposed portions of the metal lines 102 of FIG. 3. Although polymer 116A is formed on or above the surface modification layer 114 described in association with FIG. 3 (see cross-sectional views (b) and (d) of FIG. 4A), it is to be understood that, in other embodiments, the surface modification layer 114 can be omitted and the alternating polymers or alternating polymer components can instead be formed directly in the structure described in association with FIG. 2.

Referring again to FIG. 4A, in an embodiment, once the surface of the underlying structure (e.g., structure 100 of FIG. 1) has been prepared (e.g., such as the structure of FIG. 2 or the structure of FIG. 3) or is used directly, a 50-50 diblock copolymer, such as polystyrene-polymethyl methacrylate (PS-PMMA), is coated on the substrate and annealed to drive self assembly, leading to the polymer 116A/polymer 116B layer 116 of FIG. 4A. In one such embodiment, with appropriate surface energy conditions, the block copolymers segregate based on the underlying material exposed between ILD lines 110. For example, in a specific embodiment, polystyrene aligns selectively to the exposed portions of underlying metal lines 102 (or corresponding metal line cap or hardmask material). Meanwhile, the polymethyl methacrylate aligns selectively to the exposed portions of ILD lines 104 (or corresponding metal line cap or hardmask material).

Thus, in an embodiment, the underlying metal and ILD grid, as exposed between ILD lines 110 is recreated in the block co-polymer (BCP, i.e., polymer 116A/polymer 116B). This can particularly be so if the BCP pitch is commensurate with the underlying grating pitch. The polymer grid (polymer 116A/polymer 116B) is, in one embodiment, robust against certain small deviations from a perfect grid. For example, if small plugs effectively place an oxide or like material where a perfect grid would have metal, a perfect polymer 116A/polymer 116B grid can still be achieved.

However, since the ILD lines grating is, in one embodiment, an idealized grating structure, with no metal disruptions of the ILD backbone, it may be necessary to render the ILD surface neutral since both types of polymer (116A and 116B) will, in such an instance, be exposed to ILD like material while only one type is exposed to metal.

In an embodiment, the thickness of the coated polymer (polymer 116A/polymer 116B) is approximately the same as, or slightly thicker than, the ultimate thickness of an ILD ultimately formed in its place. In an embodiment, as described in greater detail below, the polymer grid is formed not as an etch resist, but rather as scaffolding for ultimately growing a permanent ILD layer there around. As such, the thickness of the polymer 116 (polymer 116A/polymer 116B) can be important since it may be used to define the ultimate thickness of a subsequently formed permanent ILD layer. That is, in one embodiment, the polymer grating shown in FIG. 4A is eventually replaced with an ILD grating of roughly the same thickness.

In an embodiment, as mentioned above, the grid of polymer 116A/polymer 116B of FIG. 4A is a block copolymer. In one such embodiment, the block copolymer molecule is a polymeric molecule formed of a chain of covalently bonded monomers. In a block copolymer, there are at least two different types of monomers, and these different types of monomers are primarily included within different blocks or contiguous sequences of monomers. The illustrated block copolymer molecule includes a block of polymer 116A and a block of polymer 116B. In an embodiment, the block of polymer 116A includes predominantly a chain of covalently linked monomer A (e.g., A-A-A-A-A . . . ), whereas the block of polymer 116B includes predominantly a chain of covalently linked monomer B (e.g., B-B-B-B-B . . . ). The monomers A and B may represent any of the different types of monomers used in block copolymers known in the arts. By way of example, the monomer A may represent monomers to form polystyrene, and the monomer B may represent monomers to form poly(methyl methacrylate) (PMMA), although the scope of the invention is not so limited. In other embodiments, there may be more than two blocks. Moreover, in other embodiments, each of the blocks may include different types of monomers (e.g., each block may itself be a copolymer). In one embodiment, the block of polymer 116A and the block of polymer 116B are covalently bonded together. The block of polymer 116A and the block of polymer 116B may be of approximately equal length, or one block may be significantly longer than the other.

Typically, the blocks of block copolymers (e.g., the block of polymer 116A and the block of polymer 116B) may each have different chemical properties. As one example, one of the blocks may be relatively more hydrophobic (e.g., water repelling) and the other may be relatively more hydrophilic (water attracting). At least conceptually, one of the blocks may be relatively more similar to oil and the other block may be relatively more similar to water. Such differences in chemical properties between the different blocks of polymers, whether a hydrophilic-hydrophobic difference or otherwise, may cause the block copolymer molecules to self-assemble. For example, the self-assembly may be based on microphase separation of the polymer blocks. Conceptually, this may be similar to the phase separation of oil and water which are generally immiscible. Similarly, differences in hydrophilicity between the polymer blocks (e.g., one block is relatively hydrophobic and the other block is relatively hydrophilic), may cause a roughly analogous microphase separation where the different polymer blocks try to "separate" from each other due to chemical dislike for the other.

However, in an embodiment, since the polymer blocks are covalently bonded to one another, they cannot completely separate on a macroscopic scale. Rather, polymer blocks of a given type may tend to segregate or conglomerate with polymer blocks of the same type of other molecules in extremely small (e.g., nano-sized) regions or phases. The particular size and shape of the regions or microphases generally depends at least in part upon the relative lengths of the polymer blocks. In an embodiment, by way of example (as shown in FIG. 4A), in two block copolymers, if the blocks are approximately the same length, a grid like pattern of alternating polymer 116A lines and polymer 116B lines is generated. In another embodiment (not shown), in two block copolymers, if one of the blocks is longer than the other, but not too much longer than the other, columnar structures may formed. In the columnar structures, the block copolymer molecules may align with their shorter polymer blocks microphase separated into the interior of the columns and their longer polymer blocks extending away from the columns and surrounding the columns. For example, if the block of polymer 116A were longer than the block of polymer 116B, but not too much longer, columnar structures may formed in which many block copolymer molecules align with their shorter blocks of polymer 116B forming columnar structures surrounded by a phase having the longer blocks of polymer 116A. When this occurs in an area of sufficient size, a two-dimensional array of generally hexagonally-packed columnar structures may be formed.

In an embodiment, the polymer 116A/polymer 116B grating is first applied as an unassembled block copolymer layer portion that includes a block copolymer material applied, e.g., by brush or other coating process. The unassembled aspect refers to scenarios where, at the time of deposition, the block copolymer has not yet substantially phase separated and/or self-assembled to form nanostructures. In this unassembled form, the block polymer molecules are relatively highly randomized, with the different polymer blocks relatively highly randomly oriented and located, which is in contrast to the assembled block copolymer layer portion discussed in association with the resulting structure of FIG. 4A. The unassembled block copolymer layer portion may be applied in a variety of different ways. By way of example, the block copolymer may be dissolved in a solvent and then spin coated over the surface. Alternatively, the unassembled block copolymer may be spray coated, dip coated, immersion coated, or otherwise coated or applied over the surface. Other ways of applying block copolymers, as well as other ways known in the arts for applying similar organic coatings, may potentially be used. Then, the unassembled layer may form an assembled block copolymer layer portion, e.g., by microphase separation and/or self-assembly of the unassembled block copolymer layer portion. The microphase separation and/or self-assembly occurs through rearrangement and/or repositioning of the block copolymer molecules, and in particular to rearrangement and/or repositioning of the different polymer blocks of the block copolymer molecules.

In one such embodiment, an annealing treatment may be applied to the unassembled block copolymer in order to initiate, accelerate, increase the quality of, or otherwise promote microphase separation and/or self-assembly. In some embodiments, the annealing treatment may include a treatment that is operable to increase a temperature of the block copolymer. One example of such a treatment is baking the layer, heating the layer in an oven or under a thermal lamp, applying infrared radiation to the layer, or otherwise applying heat to or increasing the temperature of the layer. The desired temperature increase will generally be sufficient to significantly accelerate the rate of microphase separation and/or self-assembly of the block polymer without damaging the block copolymer or any other important materials or structures of the integrated circuit substrate. Commonly, the heating may range between about 50° C. to about 300° C., or between about 75° C. to about 250° C., but not exceeding thermal degradation limits of the block copolymer or integrated circuit substrate. The heating or annealing may help to provide energy to the block copolymer molecules to make them more mobile/flexible in order to increase the rate of the microphase separation and/or improve the quality of the microphase separation. Such microphase separation or rearrangement/repositioning of the block copolymer molecules may lead to self-assembly to form extremely small (e.g., nano-scale) structures. The self-assembly may occur under the influence of surface energy, molecular affinities, and other surface-related and chemical-related forces.

In any case, in some embodiments, self-assembly of block copolymers, whether based on hydrophobic-hydrophilic differences or otherwise, may be used to form extremely small periodic structures (e.g., precisely spaced nano-scale structures or lines). In some embodiments, they may be used to form nano-scale lines or other nano-scale structures that can ultimately be used to form via and openings. In some embodiments, directed self assembly of block copolymers may be used to form vias that are self aligned with interconnects, as described in greater detail below.

Referring again to FIG. 4A, in an embodiment, for a DSA process, in addition to direction from the underlying ILD/metal 104/102 surfaces the growth process can be affected by the sidewalls of the material of ILD lines 110. As such, in one embodiment, DSA is controlled through graphoepitaxy (from the sidewalls of lines 110) and chemoepitaxy (from the underlying exposed surface characteristics). Constraining the DSA process both physically and chemically can significantly aid the process from a defectivity standpoint. The resulting polymers 116A/116B have fewer degrees of freedom and are fully constrained in all directions through chemical (e.g., underlying ILD or metal lines, or surface modifications made thereto by, for example, a brush approach) and physical (e.g., from the trenches formed between the ILD lines 110).

Figure 4B:
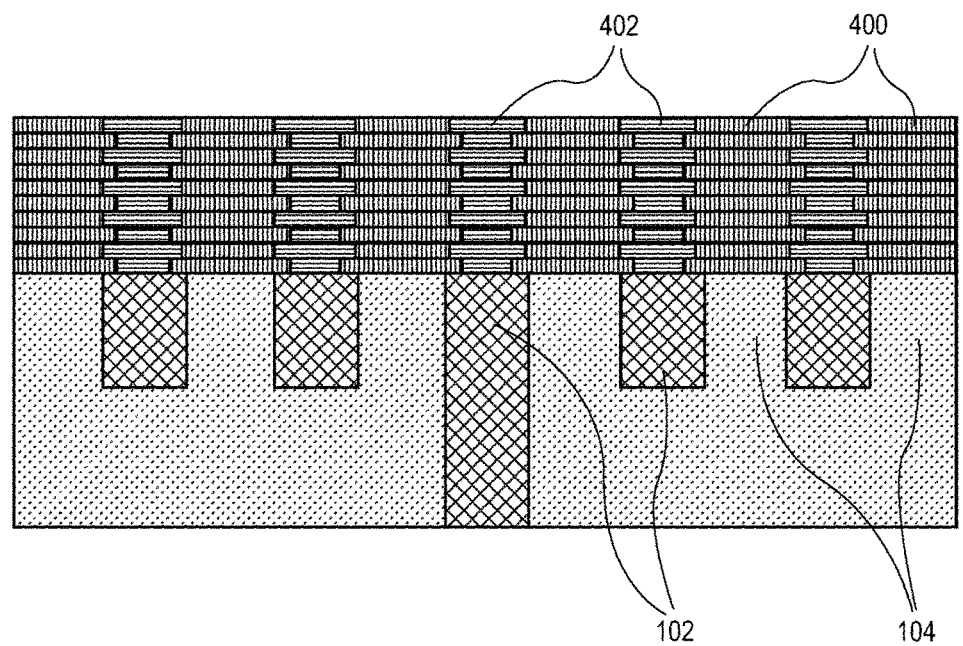
FIG. 4B illustrates a cross-sectional view of the structure of FIG. 2 following selective the exposed portions of underlying metal and ILD lines, in accordance with another embodiment of the present invention.

In an alternative embodiment, a selective growth process is used in place of a DSA approach. FIG. 4B illustrates a cross-sectional view of the structure of FIG. 2 following selective the exposed portions of underlying metal and ILD lines, in accordance with another embodiment of the present invention. Referring to FIG. 4B, a first material type 400 is grown above exposed portions of underlying ILD lines 104. A second, different, material type is grown above exposed portions of underlying metal lines 102. In an embodiment, the selective growth is achieved by a dep-etch-dep-etch approach for each of the first and second materials, resulting in a plurality of layers of each of the materials, as depicted in FIG. 4B. Such an approach may be favorable versus conventional selective growth techniques which can form "mushroom-top" shaped films. The mushroom topping film growth tendency can be reduced through an alternating deposition/etch/deposition (dep-etch-dep-etch) approach. In another embodiment, a film is deposited selectively over the metal followed by a different film selectively over the ILD (or vice versa) and repeated numerous times creating a sandwich-like stack. In another embodiment, both materials are grown simultaneously in a reaction chamber (e.g., by a CVD style process) that grows selectively on each exposed region of the underlying substrate.

Figure 5:
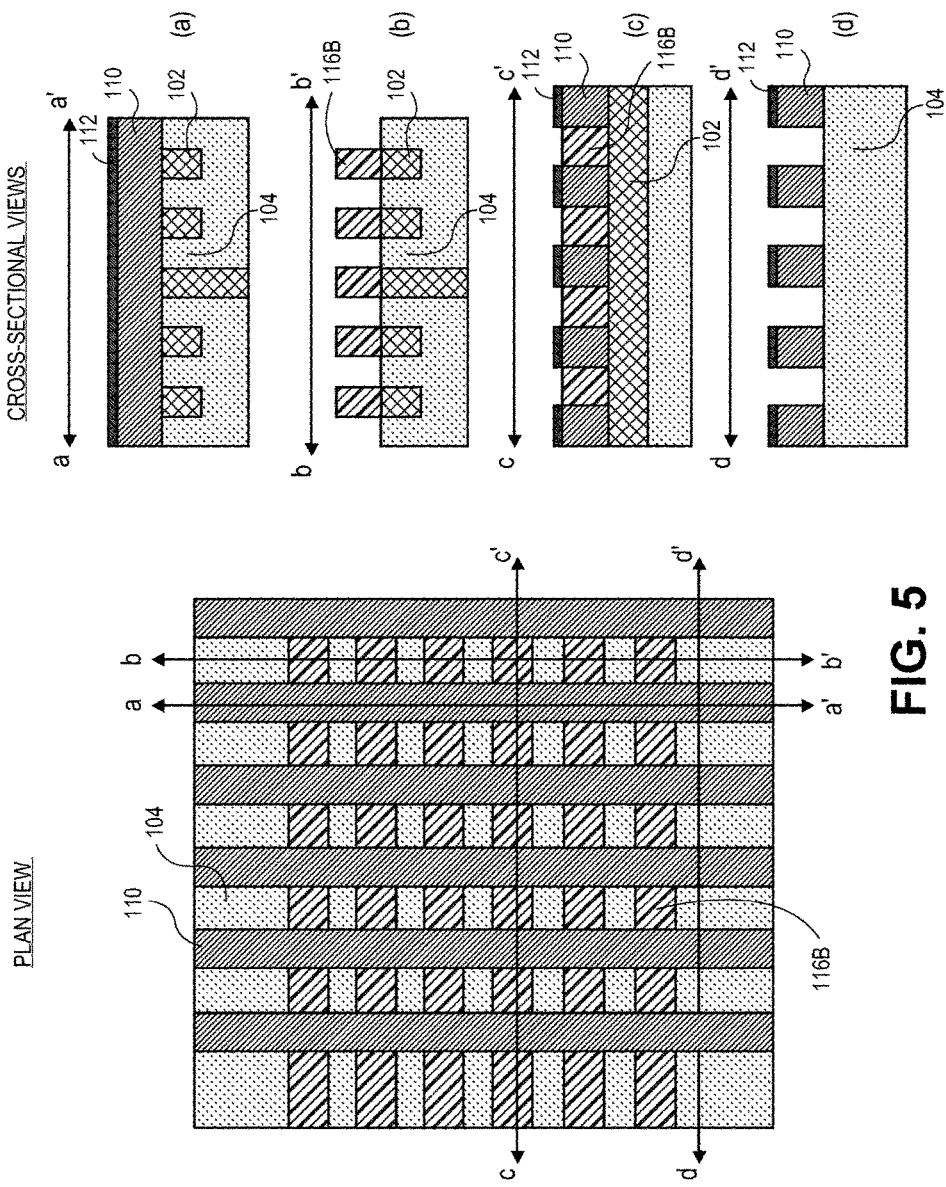

FIG. 5 illustrates a plan view and corresponding cross-sectional views of the structure of FIG. 4A following removal of one species of polymer, in accordance with an embodiment of the present invention. Referring to the plan view and corresponding cross-sectional views (a)-(d) taken along axes, a-a', b-b', c-c' and d-d', respectively, polymer or polymer portion 116A is removed to re-expose the ILD lines 104 (or hardmask or cap layers formed on the ILD lines 104), while polymer or polymer portion 116B is retained above the metal lines 102. In an embodiment, a deep ultra-violet (DUV) flood expose followed by a wet etch or a selective dry etch is used to selectively remove polymer 116A. It is to be understood that, instead of first removal of the polymer from the ILD lines 104 (as depicted), removal from the metal lines 102 may instead be first performed. Alternatively, a dielectric film is selectively grown over the region, and a mixed scaffolding is not used.

Figure 6:
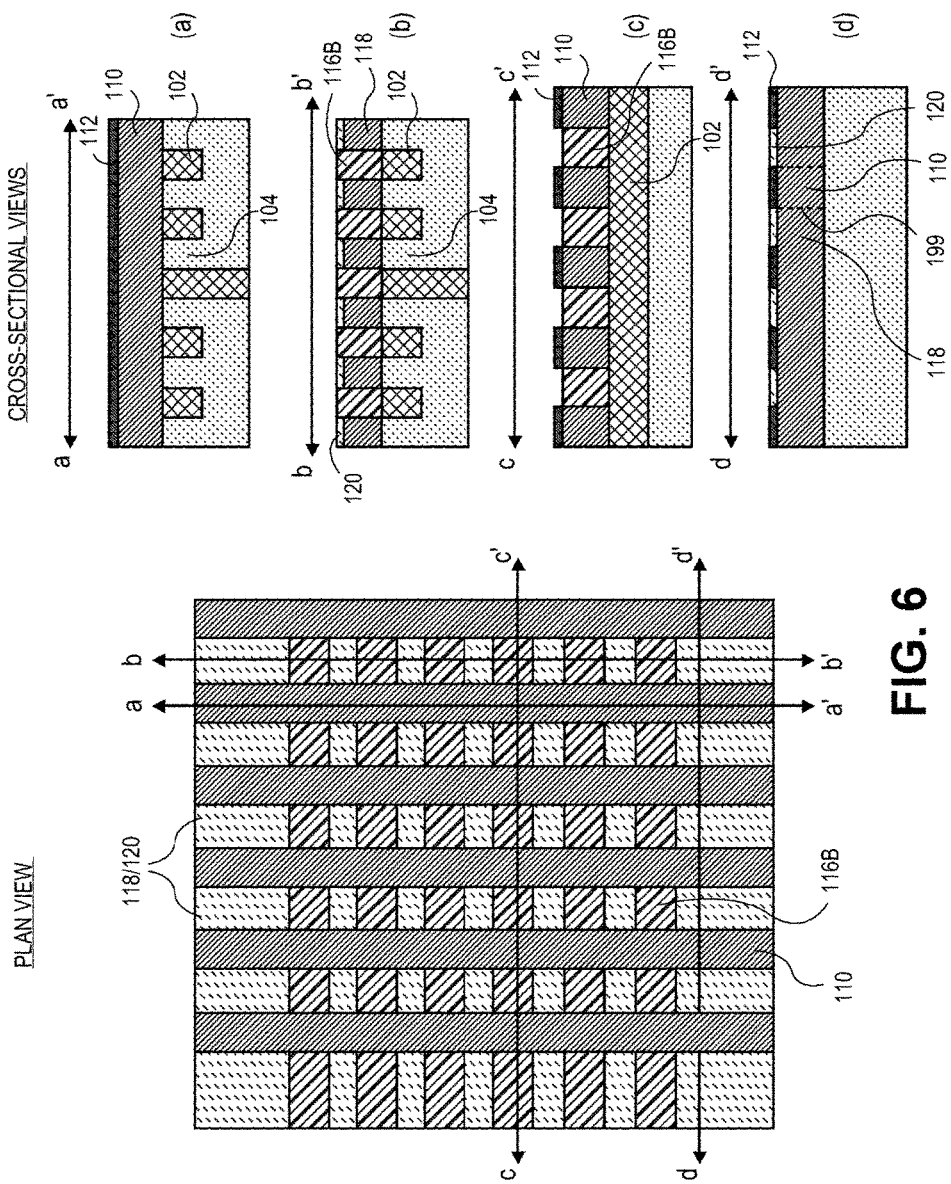

FIG. 6 illustrates a plan view and corresponding cross-sectional views of the structure of FIG. 5 following formation of an ILD material in the locations opened upon removal of the one species of polymer, in accordance with an embodiment of the present invention. Referring to the plan view and corresponding cross-sectional views (a)-(d) taken along axes, a-a', b-b', c-c' and d-d', respectively, the exposed regions of underlying ILD lines 104 are filled with a permanent interlayer dielectric (ILD) layer 118. As such, the open spaces between all possible via positions are filled with an ILD layer 118 includes a hardmask layer 120 disposed thereon, as depicted in the plan view and in the cross-sectional views (b) and (d) of FIG. 6. It is to be understood that the material of ILD layer 118 need not be the same material as ILD lines 110. In an embodiment, the ILD layer 118 is formed by a deposition and polish process. In the case where ILD layer 118 is formed with an accompanying hardmask layer 120, a special ILD fill material may be used (e.g., polymer encapsulated nanoparticles of ILD that fills holes/trenches). In such a case, a polish operation may not be necessary.

Referring again to FIG. 6, in an embodiment, the resulting structure includes a uniform ILD structure (ILD lines 110+ ILD layer 118), and the locations of all possible plugs are covered in hardmask 120 and all possible vias are in areas of polymer 116B. In one such embodiment, ILD lines 110 and ILD layer 118 are composed of a same material. In another such embodiment, ILD lines 110 and ILD layer 118 are composed of different ILD materials. In either case, in a specific embodiment, a distinction such as a seam between the materials of ILD lines 110 and ILD layer 118 may be observed in the final structure. Exemplary seams 199 are shown in FIG. 6 for illustrative purposes.

Figure 7:
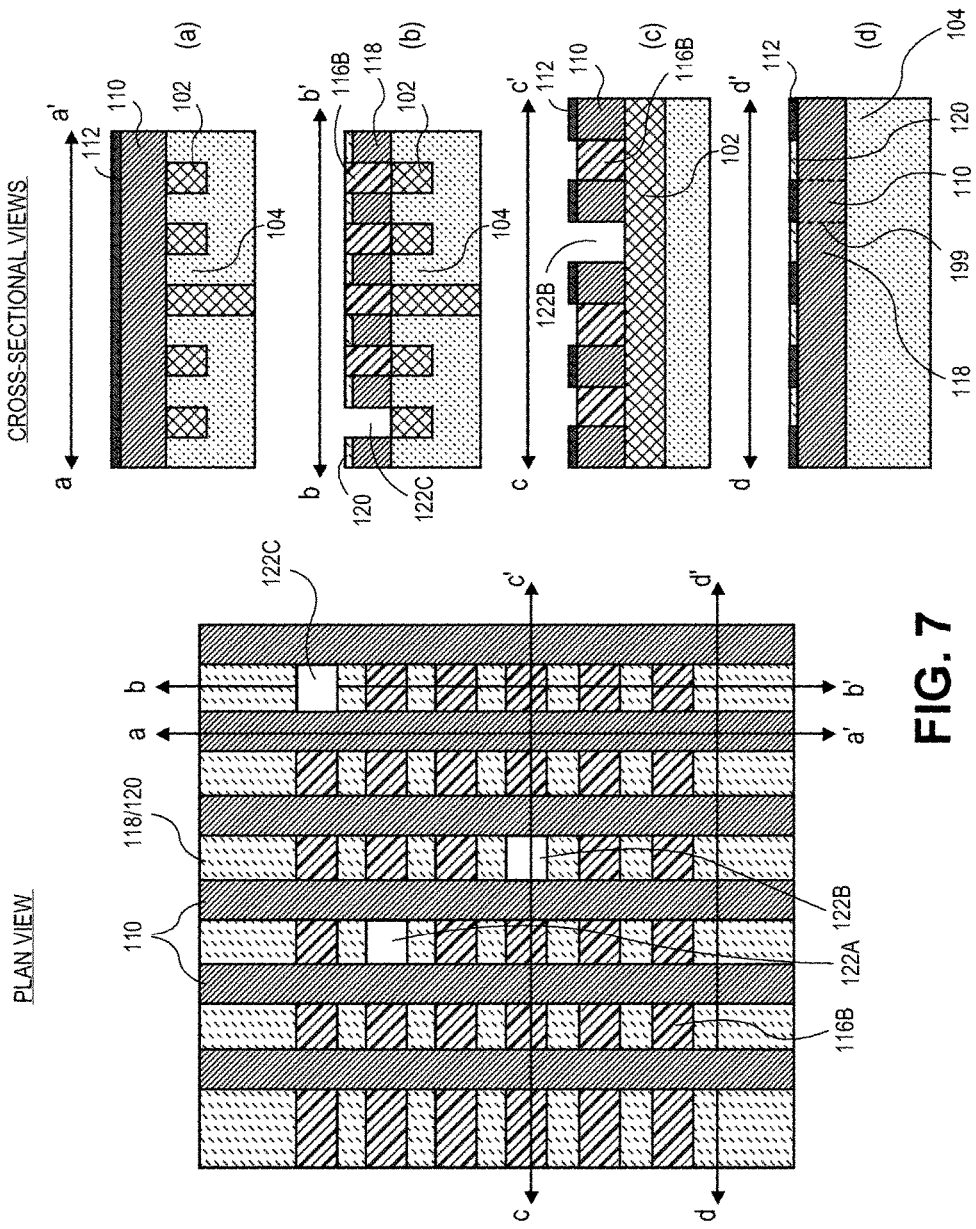

FIG. 7 illustrates a plan view and corresponding cross-sectional views of the structure of FIG. 6 following via patterning, in accordance with an embodiment of the present invention. Referring to the plan view and corresponding cross-sectional views (a)-(d) taken along axes, a-a', b-b', c-c' and d-d', respectively, via locations 122A, 122B and 122C are opened by removal of polymer 116B in select locations. In an embodiment, selective via location formation is accomplished by using a lithographic technique. In one such embodiment, polymer 116B is globally removed with an ash and refilled with photoresist. The photoresist may be highly sensitive and have a large acid diffusion and aggressive deprotection or crosslinking (depending on resist tone) because the latent image is confined in both directions by ILD (e.g., by ILD lines 110 and ILD layer 118). The resist serves as a digital switch to turn "on" or "off" depending whether a via is required in a particular location or not. Ideally, the photoresist can be used to fill the holes only, without spilling over. In an embodiment, the via locations 122A, 122B and 122C are fully confined with the process such that line edge or width roughness (LWR) and line collapse and/or reflection is mitigated if not eliminated. In an embodiment, low doses are used with EUV/EBDW and increase runrate significantly. In one embodiment, an additional advantage with the use of EBDW is that only a single shot type/size that can increase runrate by significantly reducing the number of apertures required as well as lowering the dose that needs to be delivered. In a case that 193 nm immersion lithography is used, in an embodiment, the process flow confines the via locations in both directions such the size of the via that actually is patterned is twice the size of the actual via on the wafer (e.g., assuming 1:1 line/space patterns). Alternatively, the via locations can be selected in the reverse tone where the vias that need to be retained are protected with photoresist and the remaining sites are removed and later filled with ILD. Such an approach can allow a single metal fill/polish process at the end of the patterning flow rather than two separate metal deposition steps.

Figure 8:
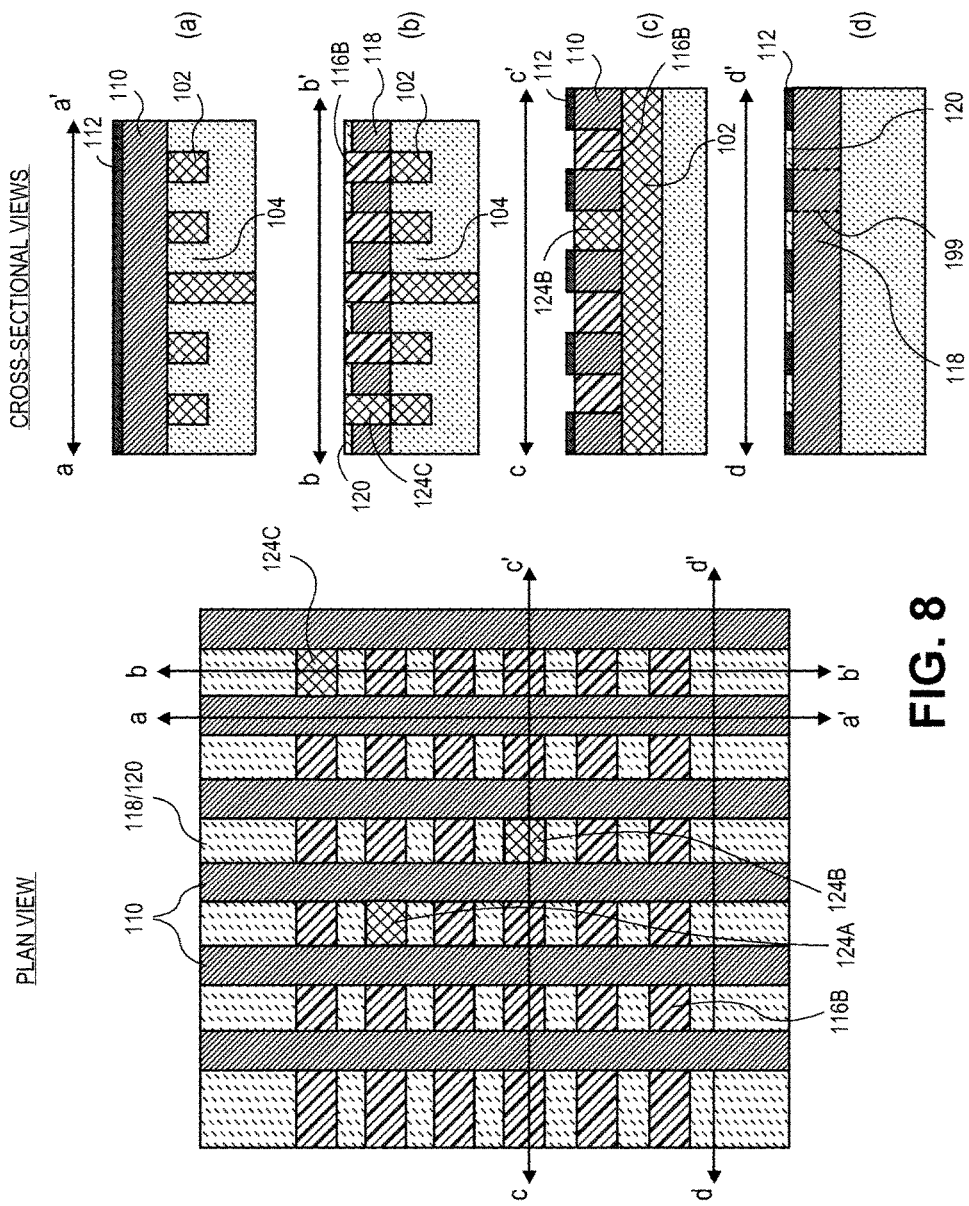

FIG. 8 illustrates a plan view and corresponding cross-sectional views of the structure of FIG. 7 following via formation, in accordance with an embodiment of the present invention. Referring to the plan view and corresponding cross-sectional views (a)-(d) taken along axes, a-a', b-b', c-c' and d-d', respectively, via locations 122A, 122B and 122C are filled with metal to form vias 124A, 124B and 124C, respectively. In an embodiment, via locations 122A, 122B and 122C are filled with excess metal, and a subsequent polish operation is performed. In another embodiment, however, via locations 122A, 122B and 122C are filled without metal overfilling and the polishing operation is omitted. It is to be understood that the via fill illustrated in FIG. 8 may be skipped in a reverse tone via selection approach.

Figure 9:
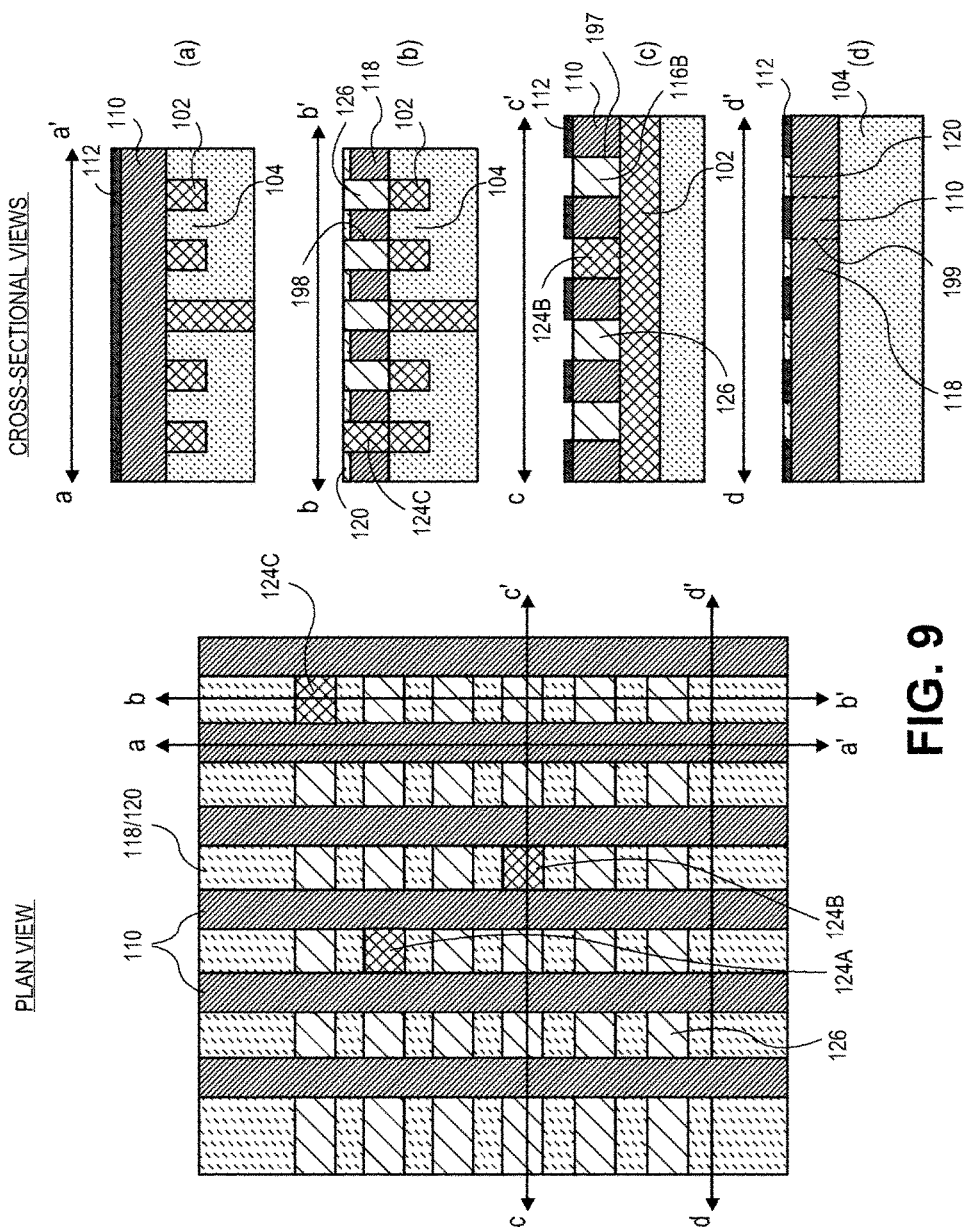

FIG. 9 illustrates a plan view and corresponding cross-sectional views of the structure of FIG. 8 following removal of the second species of polymer and replacement with an ILD material, in accordance with an embodiment of the present invention. Referring to the plan view and corresponding cross-sectional views (a)-(d) taken along axes, a-a', b-b', c-c' and d-d', respectively, remaining polymer or polymer portion 116B (e.g., where vias locations have not been selected) is removed to re-expose the metal lines 102. Subsequently, an ILD layer 126 is formed in the locations where the remaining polymer or polymer portion 116B was removed, as depicted in FIG. 9.

Referring again to FIG. 9, in an embodiment, the resulting structure includes a uniform ILD structure (ILD lines 110+ ILD layer 118+ILD layer 126), and the locations of all possible plugs are covered in hardmask 120. In one such embodiment, ILD lines 110, ILD layer 118 and ILD layer 126 are composed of a same material. In another such embodiment, two of ILD lines 110, ILD layer 118 and ILD layer 126 are composed of a same material and the third is composed of a different ILD material. In yet another such embodiment, all of ILD lines 110, ILD layer 118 and ILD layer 126 are composed of a different ILD material with respect to one another. In any case, in a specific embodiment, a distinction such as a seam between the materials of ILD lines 110 and ILD layer 126 may be observed in the final structure. Exemplary seams 197 are shown in FIG. 9 for illustrative purposes. Likewise, a distinction such as a seam between the materials of ILD layer 118 and ILD layer 126 may be observed in the final structure. Exemplary seams 198 are shown in FIG. 9 for illustrative purposes.

Figure 10:
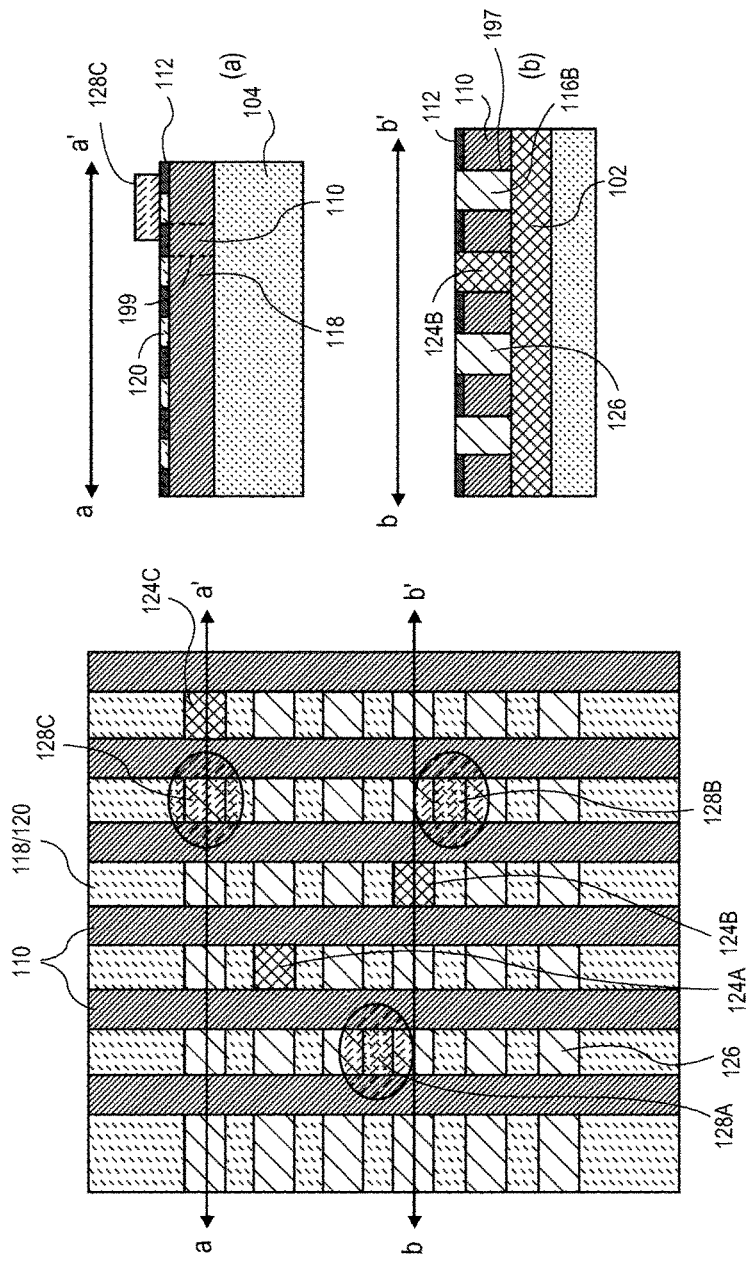

FIG. 10 illustrates a plan view and corresponding cross-sectional views of the structure of FIG. 9 following patterning of a resist or mask in selected plug locations, in accordance with an embodiment of the present invention. Referring to the plan view and corresponding cross-sectional views (a) and (b) taken along axes, a-a' and b-b', respectively, plug positions 128A, 128B and 128C are preserved by forming a mask or resist layer over those locations. Such preservation patterning may be referred to as metal end-to-end lithographic patterning, wherein plug positions are determined where breaks in subsequently formed metal lines are required. It is to be understood that since the plug locations can only be in those locations where ILD layer 118/hardmask 120 are positioned, plugs can occur over the previous layer ILD lines 104. In an embodiment, the patterning is achieved by using a lithography operation (e.g., EUV, EBDW or immersion 193 nm). In an embodiment, the process illustrated in FIG. 10, demonstrates use of a positive tone patterning process where the regions where spaces between metal need to occur are preserved. It is to be understood that, in another embodiment, it is also possible to open holes instead and reverse the tone of the process.

Figure 11:
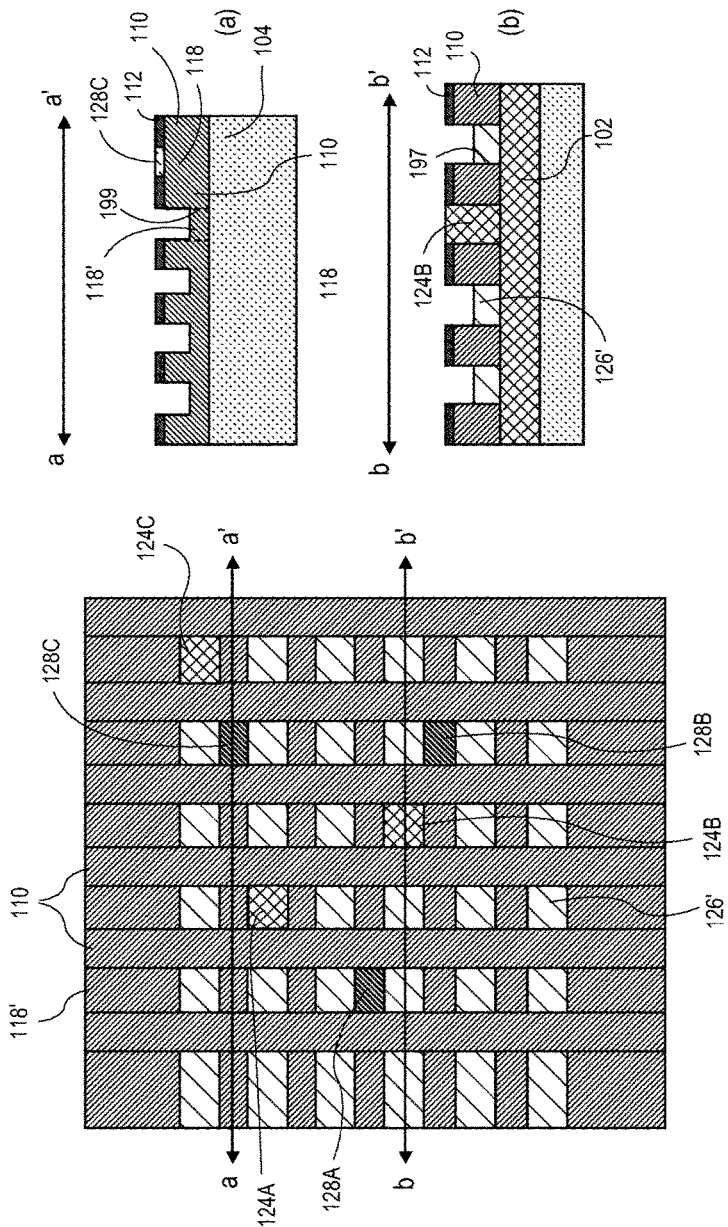

FIG. 11 illustrates a plan view and corresponding cross-sectional views of the structure of FIG. 10 following hardmask removal and ILD layer recessing, in accordance with an embodiment of the present invention. Referring to the plan view and corresponding cross-sectional views (a) and (b) taken along axes, a-a' and b-b', respectively, hardmask 120 is removed and ILD layer 118 and ILD layer 126 are recessed to form recessed ILD layer 118' and recessed ILD layer 126', respectively, by etching of these layers below their original uppermost surfaces. It is to be understood that the recessing of ILD layer 118 and ILD layer 126 is performed without etching or recessing ILD lines 110. The selectivity may be achieved by use of a hardmask layer 112 on the ILD lines (as depicted in cross-sectional views (a) and (b)). Alternatively, in a case that the ILD lines 110 are composed of an ILD material different from the material of ILD layer 118 and ILD layer 126, a selective etch may be used even in the absence of a hardmask 112. The recessing of ILD layer 118 and ILD layer 126 is to provide locations for the second level of metal lines, as isolated by ILD lines 110, as described below. The extent or depth of the recess is, in one embodiment, selected based on the desired ultimate thickness of the metal lines formed thereon. It is to be understood that the ILD layer 118 in the plug locations 128A, 128B and 128C is not recessed.

Figure 12:
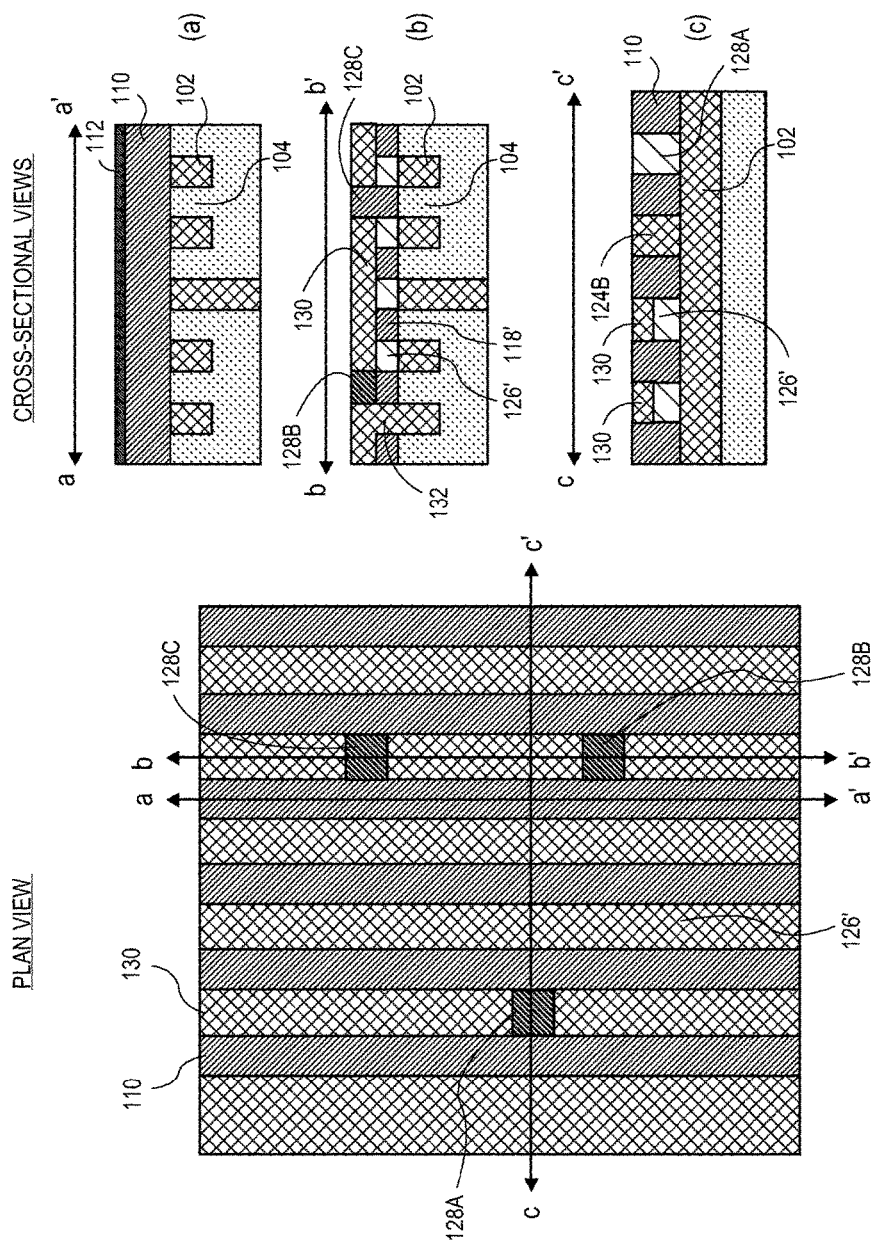

FIG. 12 illustrates a plan view and corresponding cross-sectional views of the structure of FIG. 11 following metal line formation, in accordance with an embodiment of the present invention. Referring to the plan view and corresponding cross-sectional views (a), (b) and (c) taken along axes, a-a', b-b' and c-c', respectively, metal for forming metal interconnect lines is formed conformally above the structure of FIG. 11. The metal is then planarized, e.g., by CMP, to provide metal lines 130, which are confined to locations above recessed ILD layer 118' and recessed ILD layer 126'. The metal lines 130 are coupled with underlying metal lines 102 through the predetermined via locations 124A, 124B and 124C (124B is shown in cross-sectional view (c); note that for illustrative purposes, another via 132 is depicted directly adjacent plug 128B in cross-sectional view (b) even though this is inconsistent with the previous figures). The metal lines 130 are isolated from one another by ILD lines 110 and are disrupted or broken-up by the preserved plugs 128A, 128B and 128C. Any hardmask remaining on the plug locations and/or on the ILD lines 110 may be removed at this portion of the process flow, as depicted in FIG. 12. The metal (e.g., copper and associated barrier and seed layers) deposition and planarization process to form metal lines 130 may be that typically used for standard back end of line (BEOL) single or dual damascene processing. In an embodiment, in subsequent fabrication operations, the ILD lines 110 may be removed to provide air gaps between the resulting metal lines 130.

The structure of FIG. 12 may subsequently be used as a foundation for forming subsequent metal line/via and ILD layers. Alternatively, the structure of FIG. 12 may represent the final metal interconnect layer in an integrated circuit. It is to be understood that the above process operations may be practiced in alternative sequences, not every operation need be performed and/or additional process operations may be performed. Furthermore, although the above process flow focused on applications of directed self-assembly (DSA), selective growth processes may be used instead in one or more locations of the process flow. In any case, the resulting structures enable fabrication of vias that are directly centered on underlying metal lines. That is, the vias may be wider than, narrower than, or the same thickness as the underlying metal lines, e.g., due to non-perfect selective etch processing. Nonetheless, in an embodiment, the centers of the vias are directly aligned (match up) with the centers of the metal lines. As such, in an embodiment, offset due to conventional lithograph/dual damascene patterning that must otherwise be tolerated, is not a factor for the resulting structures described herein.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 13:
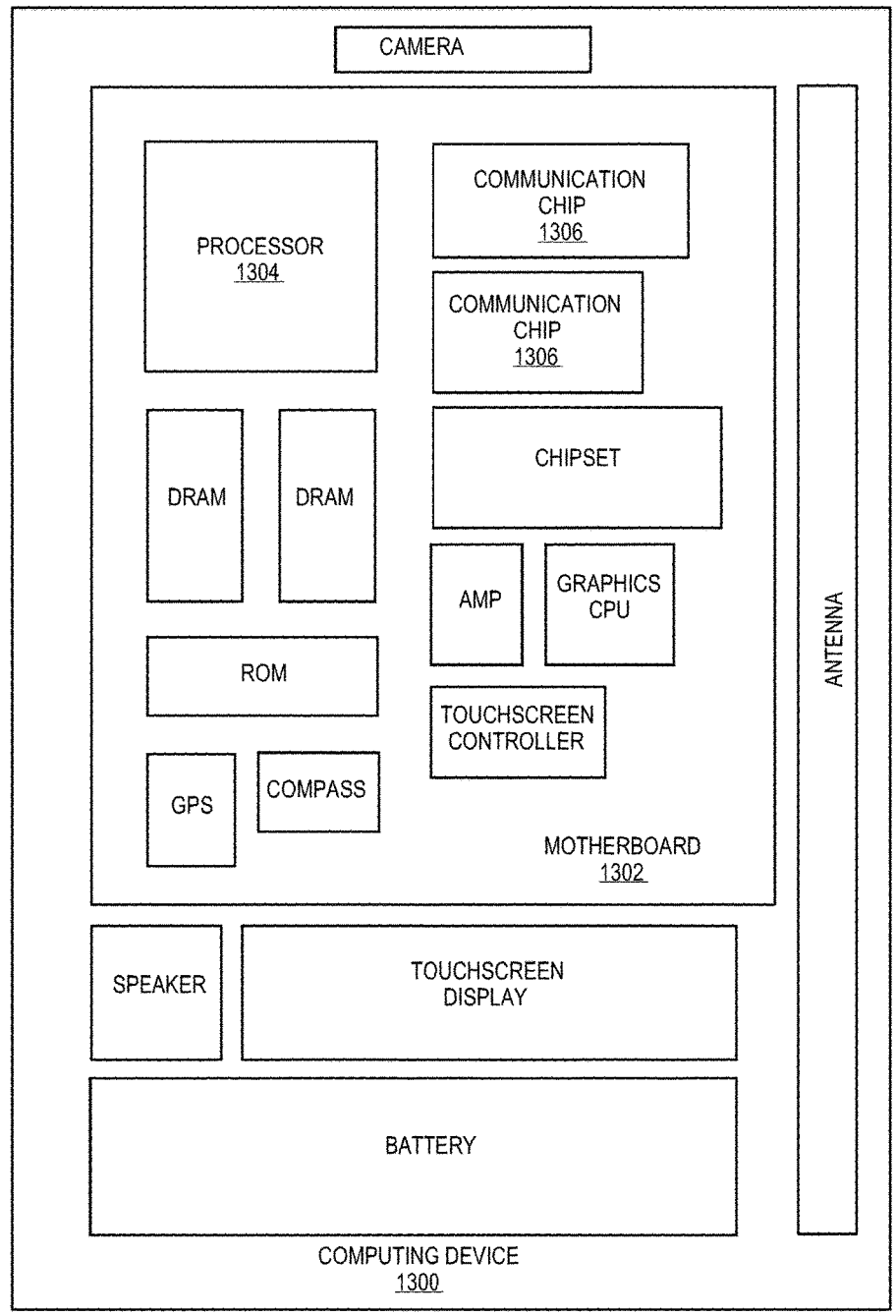
FIG. 13 illustrates a computing device in accordance with one implementation of the invention.

FIG. 13 illustrates a computing device 1300 in accordance with one implementation of the invention. The computing device 1300 houses a board 1302. The board 1302 may include a number of components, including but not limited to a processor 1304 and at least one communication chip 1306. The processor 1304 is physically and electrically coupled to the board 1302. In some implementations the at least one communication chip 1306 is also physically and electrically coupled to the board 1302. In further implementations, the communication chip 1306 is part of the processor 1304.

Depending on its applications, computing device 1300 may include other components that may or may not be physically and electrically coupled to the board 1302. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1306 enables wireless communications for the transfer of data to and from the computing device 1300. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1306 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1300 may include a plurality of communication chips 1306. For instance, a first communication chip 1306 may be dedicated to shorter range wireless communications such as Wi-Fi and Bluetooth and a second communication chip 1306 may be dedicated to longer range wireless communications such as GPS, EDGE, GPRS, CDMA, WiMAX, LTE, Ev-DO, and others.

The processor 1304 of the computing device 1300 includes an integrated circuit die packaged within the processor 1304. In some implementations of the invention, the integrated circuit die of the processor includes one or more structures, such as self-aligned vias and plugs, built in accordance with implementations of the invention. The term "processor" may refer to any device or portion of a device that processes electronic data from registers and/or memory to transform that electronic data into other electronic data that may be stored in registers and/or memory.

The communication chip 1306 also includes an integrated circuit die packaged within the communication chip 1306. In accordance with another implementation of the invention, the integrated circuit die of the communication chip includes one or more structures, such as self-aligned vias and plugs, built in accordance with implementations of the invention.

In further implementations, another component housed within the computing device 1300 may contain an integrated circuit die that includes one or more structures, such as self-aligned vias and plugs, built in accordance with implementations of the invention.

In various implementations, the computing device 1300 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1300 may be any other electronic device that processes data.

Thus, embodiments of the present invention include self-aligned via and plug patterning for back end of line (BEOL) interconnects.

In an embodiment, an interconnect structure for an integrated circuit includes a first layer of the interconnect structure disposed above a substrate. The first layer includes a grating of alternating metal lines and dielectric lines in a first direction. A second layer of the interconnect structure is disposed above the first layer. The second layer includes a grating of alternating metal lines and dielectric lines in a second direction, perpendicular to the first direction. Each metal line of the grating of the second layer is disposed on a recessed dielectric line having alternating distinct regions of a first dielectric material and a second dielectric material corresponding to the alternating metal lines and dielectric lines of the first layer of the interconnect structure. Each dielectric line of the grating of the second structure has a continuous region of a third dielectric material distinct from the alternating distinct regions of the first dielectric material and the second dielectric material.

In one embodiment, a metal line of the second layer is electrically coupled to a metal line of the first layer by a via having a center directly aligned with a center of the metal line of the first layer and with a center of the metal line of the second layer.

In one embodiment, a metal line of the second layer is disrupted by a plug having a center directly aligned with a center of a dielectric line of the first layer.

In one embodiment, none of the first dielectric material, the second dielectric material, and the third dielectric material are the same.

In one embodiment, only two of the first dielectric material, the second dielectric material, and the third dielectric material are the same.

In one embodiment, the alternating distinct regions of the first dielectric material and the second dielectric material are separated by seams, and the continuous region of the third dielectric material is separated from the alternating distinct regions of the first dielectric material and the second dielectric material by seams.

In one embodiment, all of the first dielectric material, the second dielectric material, and the third dielectric material are the same.

In an embodiment, a method of fabricating an interconnect structure for an integrated circuit involves providing a previous layer metallization structure of an alternating metal line and dielectric line first grating pattern having a first direction. The method also involves forming a dielectric line second grating pattern above the previous layer metallization structure, the dielectric line second grating pattern having a second direction, perpendicular to the first direction. The method also involves forming a sacrificial structure above the first grating pattern and between the dielectric lines of the second grating pattern. The method also involves replacing portions of the sacrificial structure above and aligned with the metal lines of the first grating pattern with a first dielectric layer, and replacing portions of the sacrificial structure above and aligned with the dielectric lines of the first grating pattern with a second dielectric layer. The method also involves forming one or more conductive vias in the first dielectric layer. The method also involves recessing portions of the first and second dielectric layers. The method also involves forming a plurality of metal lines in the recessed portions of the first and second dielectric layers, coupled with the one or more conductive vias, the plurality of metal lines having the second direction.

In one embodiment, the method further involves forming one or more plug locations in the second dielectric layer.

In one embodiment, a metal line of the plurality of metal lines in the recessed portions of the first and second dielectric layers is electrically coupled to a metal line of the previous layer metallization structure by one of the one or more conductive vias, the conductive via having a center directly aligned with a center of the metal line of the previous layer metallization structure and with a center of the metal line of the plurality of metal lines in the recessed portions of the first and second dielectric layers.

In one embodiment, forming the plurality of metal lines involves forming and planarizing a metal layer.

In one embodiment, the method further involves forming an air-gap structure amongst the plurality of metal lines in the recessed portions of the first and second dielectric layers by removing the dielectric lines of the second grating pattern.

In one embodiment, forming the sacrificial structure above the first grating pattern and between the dielectric lines of the second grating pattern involves using a directed self-assembly (DSA) technique.

In one embodiment, using the DSA technique involves forming a 50-50 diblock polystyrene-polymethyl methacrylate (PS-PMMA) copolymer.

In one embodiment, forming the sacrificial structure above the first grating pattern and between the dielectric lines of the second grating pattern involves using a selective growth technique.

In one embodiment, forming the first dielectric layer and the second dielectric material layer involves forming a different material for each layer.

In one embodiment, forming the first dielectric layer and the second dielectric material layer involves forming a same material for each layer.

In an embodiment, a method of fabricating an interconnect structure for an integrated circuit involves providing a previous layer metallization structure having an alternating metal line and dielectric line first grating pattern having a first direction. The method also involves forming a dielectric line second grating pattern above the previous layer metallization structure. The dielectric line second grating pattern has a second direction, perpendicular to the first direction. The method also involves forming a polymer structure above the first grating pattern and within the second grating pattern. The polymer structure includes a first polymer species disposed above and aligned with the metal lines of the first grating pattern and a second polymer species disposed above and aligned with the dielectric lines of the first grating pattern. The method also involves removing the first polymer species from the polymer structure. The method also involves forming a first permanent dielectric layer above and aligned with the metal lines of the first grating pattern, and adjacent to the second polymer species. The method also involves replacing one or more regions of the first permanent dielectric layer with a conductive via. The method also involves, subsequently, removing the second polymer species from the polymer structure to provide openings above and aligned with the dielectric lines of the first grating pattern. The method also involves forming a second permanent dielectric layer above and aligned with the dielectric lines of the first grating pattern. The method also involves protecting one or more plug locations by forming a hardmask pattern on portions of the second permanent dielectric layer. The method also involves recessing exposed portions of the first and second permanent dielectric layers, selective to the hardmask pattern. The method also involves forming a metal layer in the recessed portions of the first and second permanent dielectric layers.

In one embodiment, the method further involves removing the dielectric lines of the second grating pattern to form an air-gap structure.

In one embodiment, forming the polymer structure above the first grating pattern and within the second grating pattern involves using a directed self-assembly (DSA) technique.

In one embodiment, using the DSA technique involves forming a 50-50 diblock polystyrene-polymethyl methacrylate (PS-PMMA) copolymer.

In one embodiment, forming the polymer structure above the first grating pattern and within the second grating pattern involves using a selective growth technique.

In one embodiment, forming the first permanent dielectric layer and the second permanent dielectric material layer involves forming a different material.

In one embodiment, forming the dielectric line second grating pattern involves forming a dielectric material layer different from the materials of the first and second permanent dielectric material layers.

In one embodiment, forming the first permanent dielectric layer and the second permanent dielectric material layer involves forming a same material.

What is claimed is:

1. An integrated circuit structure, comprising:
   a plurality of metal lines, wherein individual one of the plurality of metal lines is on a dielectric structure comprising alternating regions of a first dielectric material and a second dielectric material, wherein an individual one of the plurality of metal lines is disrupted by a dielectric plug; and
   a plurality of dielectric material lines laterally alternating with the individual ones of the plurality of metal lines, wherein individual ones of the plurality of dielectric lines comprises a third dielectric material distinct from the alternating regions of the first dielectric material and the second dielectric material.

2. The integrated circuit structure of claim 1, wherein the first dielectric material, the second dielectric material, and the third dielectric material are each composed of a different material.

3. The integrated circuit structure of claim 1, wherein only two of the first dielectric material, the second dielectric material, and the third dielectric material are the same.

4. The integrated circuit structure of claim 1, wherein the alternating regions of the first dielectric material and the second dielectric material are separated by seams, and wherein the third dielectric material is separated from the alternating regions of the first dielectric material and the second dielectric material by seams.

5. The integrated circuit structure of claim 1, wherein all of the first dielectric material, the second dielectric material, and the third dielectric material have a same composition.

6. An integrated circuit structure, comprising:
   a first layer of an interconnect structure above a substrate, the first layer comprising alternating metal lines and dielectric lines in a first direction; and
   a second layer of the interconnect structure above the first layer, the second layer comprising alternating metal lines and dielectric lines in a second direction, perpendicular to the first direction, wherein each metal line of the second layer is on a recessed dielectric line comprising alternating regions of a first dielectric material and a second dielectric material corresponding to the alternating metal lines and dielectric lines of the first layer of the interconnect structure.

7. The integrated circuit structure of claim 6, wherein a metal line of the second layer is electrically coupled to a metal line of the first layer by a via.

8. The integrated circuit structure of claim 7, wherein the via has a center directly aligned with a center of the metal line of the first layer and with a center of the metal line of the second layer.

9. The integrated circuit structure of claim 6, wherein a metal line of the second layer is disrupted by a plug having a center directly aligned with a center of a dielectric line of the first layer.

10. The integrated circuit structure of claim 6, wherein the first dielectric material and the second dielectric material are each composed of a different material.

11. The integrated circuit structure of claim 6, wherein the first dielectric material and the second dielectric material are composed of a same material.

12. The integrated circuit structure of claim 6, wherein the alternating regions of the first dielectric material and the second dielectric material are separated by seams.

13. An integrated circuit structure, comprising:
   a first layer of an interconnect structure above a substrate, the first layer comprising alternating metal lines and dielectric lines in a first direction; and
   a second layer of the interconnect structure above the first layer, the second layer comprising alternating metal lines and dielectric lines in a second direction, perpendicular to the first direction, wherein each metal line of the second layer is on alternating regions of a first dielectric material and a second dielectric material, the first dielectric material and the second dielectric material forming lines along the first direction, and wherein each dielectric line of the second layer comprises a third dielectric material.

14. The integrated circuit structure of claim 13, wherein a metal line of the second layer is electrically coupled to a metal line of the first layer by a via having a center directly aligned with a center of the metal line of the first layer and with a center of the metal line of the second layer.

15. The integrated circuit structure of claim 13, wherein a metal line of the second layer is disrupted by a plug having a center directly aligned with a center of a dielectric line of the first layer.

16. The integrated circuit structure of claim 13, wherein none of the first dielectric material, the second dielectric material, and the third dielectric material are composed of a same material.

17. The integrated circuit structure of claim 13, wherein only two of the first dielectric material, the second dielectric material, and the third dielectric material are composed of a same material.

18. The integrated circuit structure of claim 13, wherein the alternating regions of the first dielectric material and the second dielectric material are separated by seams, and wherein the third dielectric material is separated from the alternating regions of the first dielectric material and the second dielectric material by seams.

19. The integrated circuit structure of claim 13, wherein all of the first dielectric material, the second dielectric material, and the third dielectric material are composed of a same material.

* * * * *